(12) United States Patent
Cha

(10) Patent No.: US 7,050,352 B2
(45) Date of Patent: May 23, 2006

(54) DATA INPUT APPARATUS OF DDR SDRAM AND METHOD THEREOF

(75) Inventor: Jae Hoon Cha, Icheon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/878,179

(22) Filed: Jun. 28, 2004

(65) Prior Publication Data

US 2005/0232033 A1  Oct. 20, 2005

(30) Foreign Application Priority Data

Apr. 20, 2004  (KR) ...................... 10-2004-0027091

(51) Int. Cl.
*G11C 8/00* (2006.01)
(52) U.S. Cl. ...................... 365/233; 365/193; 365/194
(58) Field of Classification Search ................. 365/233
See application file for complete search history.

(56) References Cited

U.S. PATENT DOCUMENTS

| 6,324,119 B1 * | 11/2001 | Kim ........................... 365/233 |
| 6,636,446 B1 * | 10/2003 | Lee et al. ................... 365/194 |
| 6,671,787 B1 * | 12/2003 | Kanda et al. ........... 365/189.02 |
| 6,707,723 B1 * | 3/2004 | Jeong ................... 365/189.05 |

* cited by examiner

*Primary Examiner*—Thong Q. Le
(74) *Attorney, Agent, or Firm*—Marshall, Gerstein & Borun LLP

(57) ABSTRACT

Provided is directed to a data input apparatus and a method of DDR SDRAM which can improve reliability of a circuit operation by transferring data inputted after applying a data strobe signal DQS to an input/output bus GIO by a exact timing, by means of correctly arranging the data strobe signal DQS and a data input strobe pulse dinstbp regardless of time difference of inputting the data strobe signal DQS after a write command, in response to generating a data input strobe pulse dinstbp used to load data to the input/output bus GIO as a data strobe pulse dsp identical to the data strobe signal DQS.

8 Claims, 5 Drawing Sheets

DATA INPUT APPARATUS OF DDR SDRAM AND METHOD THEREOF

This application relies for priority upon Korean Patent Application No. 2004-0027091 filed on Apr. 20, 2004, the contents of which are herein incorporated by reference in their entirety.

BACKGROUND

1. Field of the Invention

The present invention relates to a data input apparatus of a DDR SDRAM and a method thereof, and more particularly to, a data input apparatus of a DDR SDRAM and a method capable of correctly arranging an input control signal and a data input operation.

2. Discussion of Related Art

As well known, DRAM among semiconductor memory devices has used a synchronous DRAM (hereinafter, SDRAM) operated in synchronization with an external system clock in order to improve an operation speed. On the other hand, a general SDRAM is a device inputting/outputting one data for a cycle period by synchronizing with a rising edge of a clock, while DDR SDRAM can input/output two data in sequence by synchronizing with rising and falling edges of the clock. Accordingly, without increasing a frequency of a clock, the DDR SDRAM has been considered as a next generation DRAM by means of embodying an operation speed two times as fast as the conventional SDRAM.

FIG. 1 is a block diagram illustrating a data input path of DDR SDRAM of the conventional art.

Referring to FIG. 1, a data input path of the DDR SDRAM is comprised of: a data strobe buffer 110 for buffering a data strobe signal DQS in response to an enable signal endindsb; a data strobe signal division unit 120 for generating a rising edge detecting pulse signal rdinclk and a falling edge detecting pulse signal fdinclk by dividing a signal outputted from the data strobe buffer 110; a data input buffer 130 for buffering an input data inputted from an input terminal DQ in response to the enable signal endindsb; a rising data latch 141 for latching the input data DIN outputted from the data input buffer 130 in response to the rising edge detecting pulse signal rdinclk; a falling data latch 142 for outputting a data as a falling data dinf by latching the input data DIN outputted from the data input buffer 130 in response to the falling edge detecting pulse signal fdinclk; a data arranging unit 150 for outputting a data dunr6 as a rising data dinr by arranging a falling data dinf with the data dinr6 outputted from the rising data latch 141 in response to the falling edge detecting pulse signal fdinclk; an input control signal generation unit 170 for generating a data input strobe pulse dinstbp in response to a clock signal pulse clkp2 and a control signal soseb_wt deciding a data outputted earlier than the other of an even data and an odd data; a global input/output transmission unit 160 for transferring the rising data dinr and the falling data dinf to a global input/output bus GIO in response to the data input strobe pulse dinstbp.

FIG. 2 is a timing diagram illustrating a data input path of DDR SDRAM shown in FIG. 1.

Referring to FIG. 2, in case of the DDR SDRAM, two data are accessed for one cycle period of the data strobe signal DQS. During this, the data DIN entering by being synchronized with the data strobe signal DQS is divided into the rising data dinr and the falling data dinf passing through the data input buffer 130, the rising data latch 141, and the data arranging unit 150, and these data dinr, dinf are transferred to the global input/output bus GIO passing through the global input/output transmission unit 160. The global input/output transmission unit 160 transfers the rising data dinr and the falling data dinf to the global input/output bus GIO in response to the data input strobe pulse dinstbp, and the data input strobe pulse dinstbp is generated by the clock pulse clkp2 when the control signal soseb_wt is applied to the input control signal generation unit 170 shown in FIG. 1.

As aforementioned, the data input strobe pulse dinstbp is constant because of being generated by the clock pulse clkp2 but the data strobe signal DQS is inputted within a predetermined time tDQSSmin to tDQSSmax after inputting a write command WT. In response to this, according to the time tDQSSmin to tDQSSmax inputting the data strobe signal DQS, a margin between the data strobe signal DQS and the data input strobe pulse dinstbp is varied. As a result, it is not correctly performed for a timing of inputting the rising data dinr and the falling data dinf to the global input/output transmission unit 160, and arrangement of those data dinr or dinf and the data input strobe pulse dinstbp, as a command signal for loading those data dinr, dinf to the output bus GIO.

For instance, after the write command is inputted and the tDQSSmax is passed, if the data strobe signal DQS is applied, the data input strobe pulse dinstbp is correctly inputted while the data dinr or dinf is inputted to the global input/output transmission unit 160. As a result, the data dinr or dinf is exactly loaded to the output bus GIO. However, after the write command is inputted and the tDQSSmin is passed, if the data strobe signal DQS is applied, the data dinr, dinf are inputted to the global input/output transmission unit 160 and the data input strobe pulse dinstbp is inputted later. Accordingly, a misalignment A is occurred and a margin for an input operation is reduced. In worse case, the first data input strobe pulse dinstbp is inputted at a timing that the next data is inputted, so that it is impossible to perform a correct data loading.

As described above, as there isn't constant time tDQSSmin to tDQSSmax inputting the data strobe signal DQS after a write command and the data input strobe pulse dinstbp loading the data is constantly generated by the clock signal pulse clkp2, it is difficult to arrange data. Furthermore, if an operation speed is getting fast or if misalignment is getting larger, it causes a failure in transferring data.

SUMMARY OF THE INVENTION

The present invention is directed to provide a data input apparatus and a method of DDR SDRAM which can improve reliability of a circuit operation by transferring data inputted after applying a data strobe signal DQS to an output bus GIO by a exact timing, by means of correctly arranging the data strobe signal DQS with a data input strobe pulse dinstbp regardless of time difference tDQSSmin to tDQSSmax of inputting the data strobe signal DQS after a write command, in response to generating a data input strobe pulse dinstbp used to load data to the output bus GIO as a data strobe pulse dsp identical to the data strobe signal DQS.

One aspect of the present invention is to provide a data input apparatus of DDR SDRAM including: a data strobe buffer for outputting a data strobe signal as a pulse-type data strobe pulse signal, with outputting first and second signals by dividing the data strobe signal; a data strobe signal division unit for generating a rising edge detecting pulse signal and a falling edge detecting pulse signal in response to first and second signals; a data input unit for generating a rising data and a falling data by dividing an input data inputted from an external of the chip in response to the rising edge detecting pulse signal and the falling edge detecting pulse signal; an input control signal generation unit for generating a data input strobe pulse signal for controlling that the rising data and the falling data are transferred to an output bus by the data strobe pulse signal; and a global input/output transmission unit for transferring the rising data and the falling data to an output bus line according to the data input strobe pulse signal.

Here, the data input means includes: a data input buffer for buffering an input data inputted from an input terminal; a rising data latch for latching the input data outputted from the data input buffer according to the rising edge detecting pulse signal; a falling data latch for latching the input data outputted form the data input buffer according to the falling edge detecting pulse signal and then outputting it as a falling data; and a data arranging unit for arranging data outputted from the rising data latch according to the falling edge detecting pulse signal and then outputting it as a rising data.

A data input method of a DDR SDRAM in accordance with an embodiment of the present invention includes the steps of: generating a rising edge detecting pulse signal and a falling edge detecting pulse signal with generating a data strobe signal as a pulse-type data strobe pulse signal, in response to inputting the data strobe signal; dividing the input data into a rising data and a falling data according to the rising edge detecting pulse signal and the falling edge detecting pulse signal and then outputting the rising and falling data; generating a data strobe pulse signal for controlling that the rising data and the falling data are transferred to an output terminal by the data strobe pulse signal; and transferring the rising data and the falling data to an output terminal according to the data input strobe pulse signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings.

Figure 3:
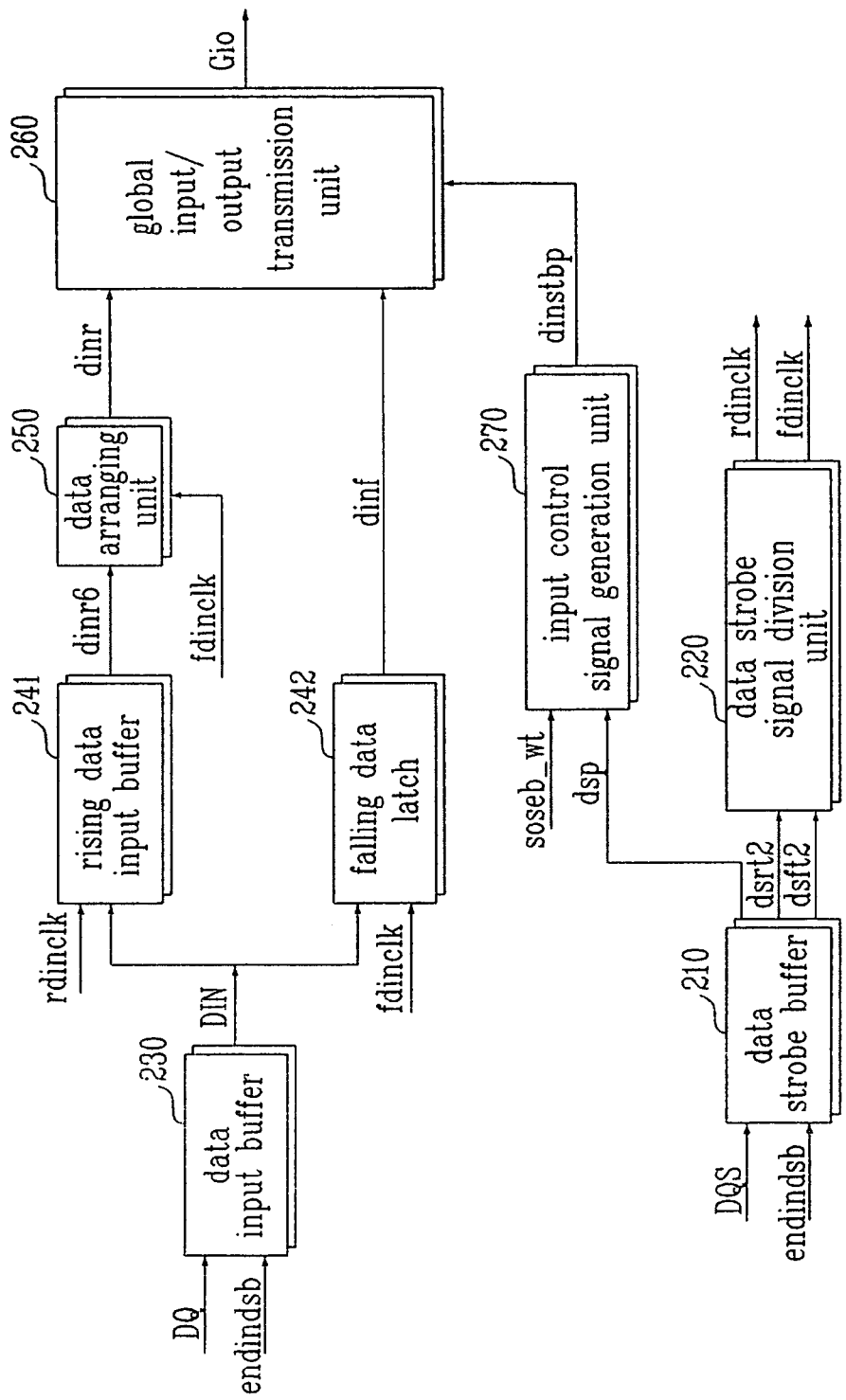
FIG. 3 is a block diagram illustrating a data input path of DDR SDRAM in accordance with an embodiment of the present invention.

FIG. 3 is a block diagram illustrating a data input path of DDR SDRAM in accordance with an embodiment of the present invention.

Referring to FIG. 3, a data input path of DDR SDRAM in accordance with an embodiment of the present invention is comprised of: a data strobe buffer 210, a data strobe signal division unit 220, a data input buffer 230, a rising data latch 241, a falling data latch 242, a data arranging unit 250, a global input/output transmission unit 260, and a input control signal generation unit 270.

Figure 1:
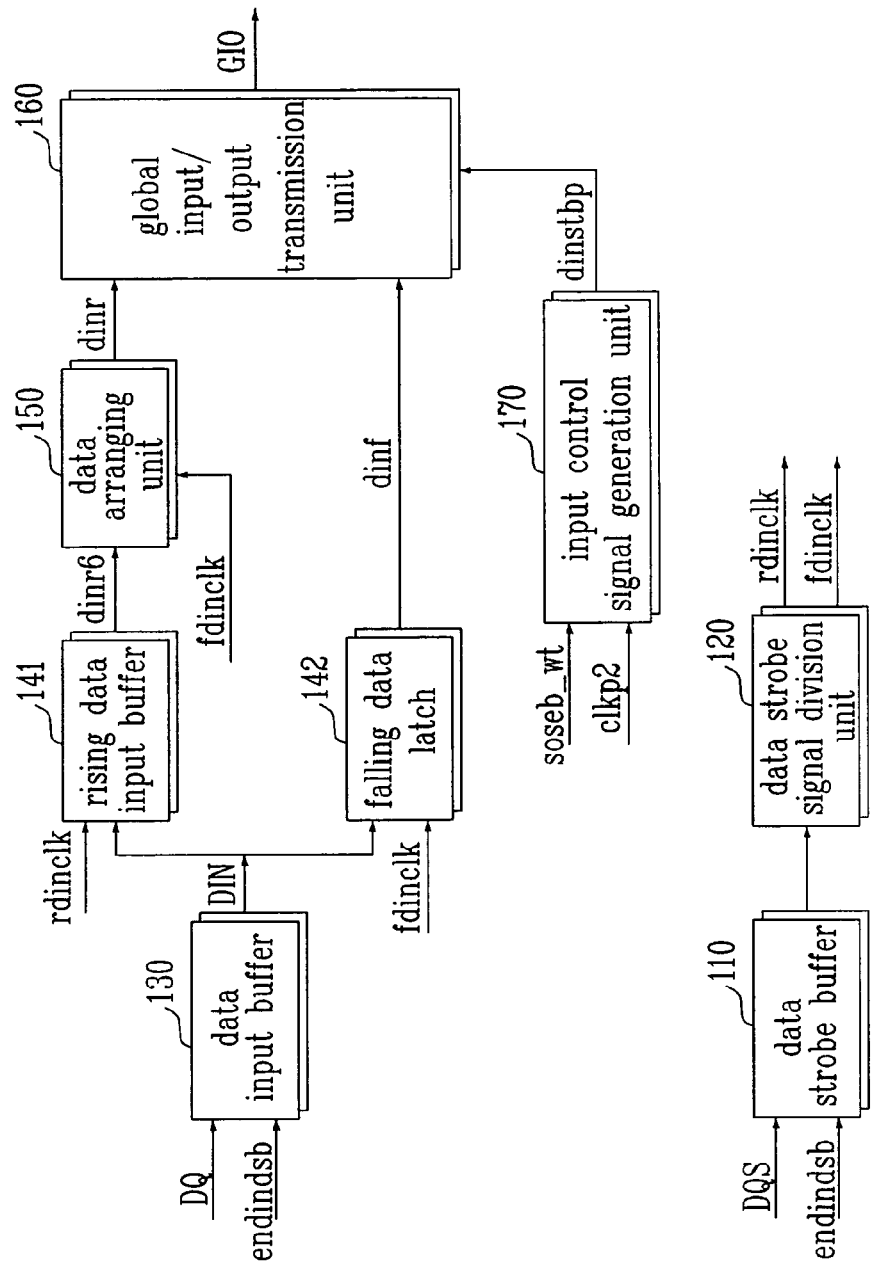
FIG. 1 is a block diagram illustrating a data input path of DDR SDRAM of the conventional art.

Here, there is a main characteristic of the present invention that the input control signal generation unit 270 generates a data input strobe pulse dinstbp as a data strobe pulse dsp outputted from the data strobe buffer 210, not generates it as a clock signal pulse (clkp2 in FIG. 1).

It will be explained of an operation of each configuration in detail as follows.

The data strobe buffer 210 buffers a data strobe signal DQS in response to an enable signal endindsb, divides it and outputs them (dsrt2 and dsft2), and outputs the data strobe signal DQS as a pulse-type data strobe pulse dsp.

The data strobe signal division unit 220 generates a rising edge detecting pulse signal rdinclk and a falling edge detecting pulse signal fdinclk in response to signals dsrt2, dsft2 divided and outputted from the data strobe buffer 210.

The data input buffer 230 buffers an input data DIN inputted from an input terminal DQ in response to the enable signal endindsb.

The rising data latch 241 latches the input data DIN outputted from the data input buffer 230 in response to the rising edge detecting pulse signal rdinclk.

The falling data latch 242 latches the input data DIN outputted from the data input buffer 230 in response to the falling edge detecting pulse signal fdinclk, to output it as a falling data dinf.

The data arranging unit 250 arranges a data dinr6 outputted from the rising data latch 241 according to the falling edge detecting pulse signal fdinclk, to output it as a rising data dinr.

Here, the data input buffer 230, the rising data latch 241, the falling data latch 242, and the data arranging unit 250 become a data input means generating the input data DIN as a rising data dinr synchronized with a rising edge of the data strobe signal DQS and as a falling data dinf synchronized with a falling edge of the data strobe signal DQS, respectively, according to the rising edge detecting pulse signal rdinclk and the falling edge detecting pulse signal fdinclk.

The input control signal generation unit 270 generates a data input strobe pulse dinstbp in response to the data strobe pulse signal dsp and a control signal soseb_wt deciding a data outputted earlier than the other of an even data and an odd data.

In the conventional art, the data input strobe pulse dinstbp is generated by a clock signal. Since the clock signal is generated as an input strobe pulse dinstbp by means of moving through a long path including a buffer, the clock signal becomes weak for a line coupling noise. As a result, it may cause to generate the input strobe pulse dinstbp with a delay. Although it isn't shown in a drawing, it may be generated faster.

However, the input control signal generation unit 270 of the present invention generates the data input strobe pulse dinstbp using the data strobe pulse dsp, so that the data strobe pulse dinstbp is generated by being exactly arranged with the data strobe signal DQS.

The global input/output transmission unit 260 transfers the rising data dinr and the falling data dinf to a global input/output bus GIO in response to the data input strobe signal dinstbp.

Figure 4:
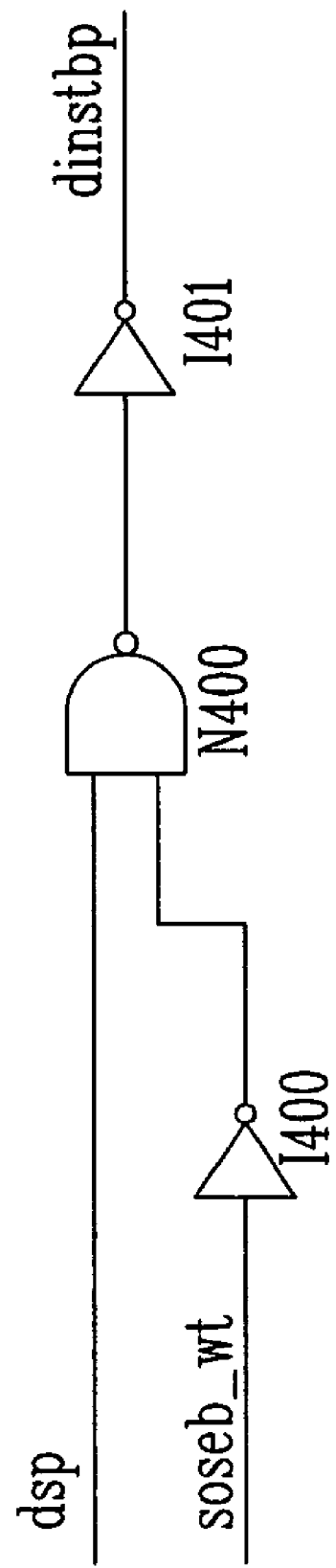
FIG. 4 is a circuit diagram illustrating an input control signal generation unit shown in FIG. 3.

FIG. 4 is a circuit diagram illustrating an input control signal generation unit of FIG. 3.

Referring to FIG. 4, the input control signal generation unit generates the data input strobe pulse dinstbp by using a control signal soseb_wt and the data strobe pulse signal dsp generated from the data strobe buffer 210. During this, the control signal soseb_wt is a signal to decide one data which will be outputted earlier than the other of an even data and an odd data. In general, when the even data is outputted earlier, the control signal soseb_wt is applied to low level.

The input control signal generation unit may be embodied with a NAND gate N400 for inputting the data strobe pulse dsp, and an inverter I401 for inverting an output signal of the NAND gate N400 and then outputting it as the data input strobe pulse dinstbp. While this, when the even data is outputted earlier, another inverter I400 is necessary to be embodied for inverting the control signal soseb_wt. The control signal soseb_wt is inverted by the inverter I400 and then applied to a first input terminal of the NAND gate N400 with an enable signal. Additionally, after inputting a write command, when the data strobe signal DQS is applied and then a pulse-type data strobe pulse dsp is inputted, the data input strobe pulse dinstbp is generated.

On the other side, the data strobe signal DQS controls that data is inputted from the external device to the internal device, as well as controls that the inputted data is transferred to a global input/output bus GIO. Accordingly, the data input strobe pulse dinstbp is generated with a delay as long as taken by transferring the input data DIN to the global input/output transmission unit 260 in FIG. 3. In this moment, because the data strobe pulse dsp is generated with a delay from the data strobe buffer (210 in FIG. 3), the data input strobe pulse dinstbp may be generated with a delay, and also the data input strobe pulse dinstbp may be generated with a delay by comprising a delay means (not shown) in the input control signal generation unit 270.

The input data strobe buffer 210 generating the data strobe pulse dsp in response to the data strobe signal DQS has been well known as already typical technique, so that it will not be described here.

Hereinafter, it will be explained of a data input method of DDR SDRAM in accordance with an embodiment of the present invention described in FIG. 3.

Figure 2:
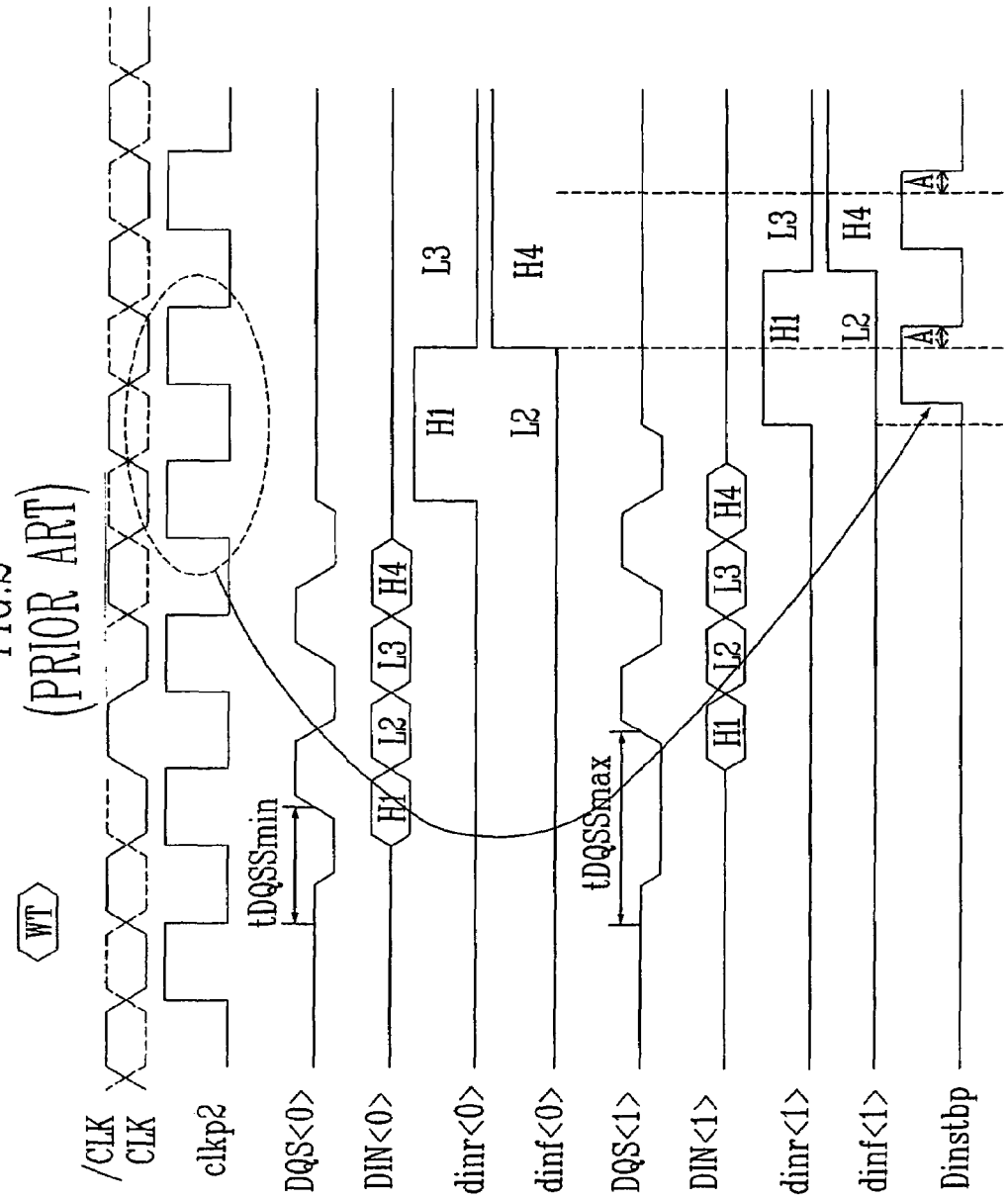
FIG. 2 is a timing diagram illustrating a data input path of DDR SDRAM shown in FIG. 1.
Figure 5:
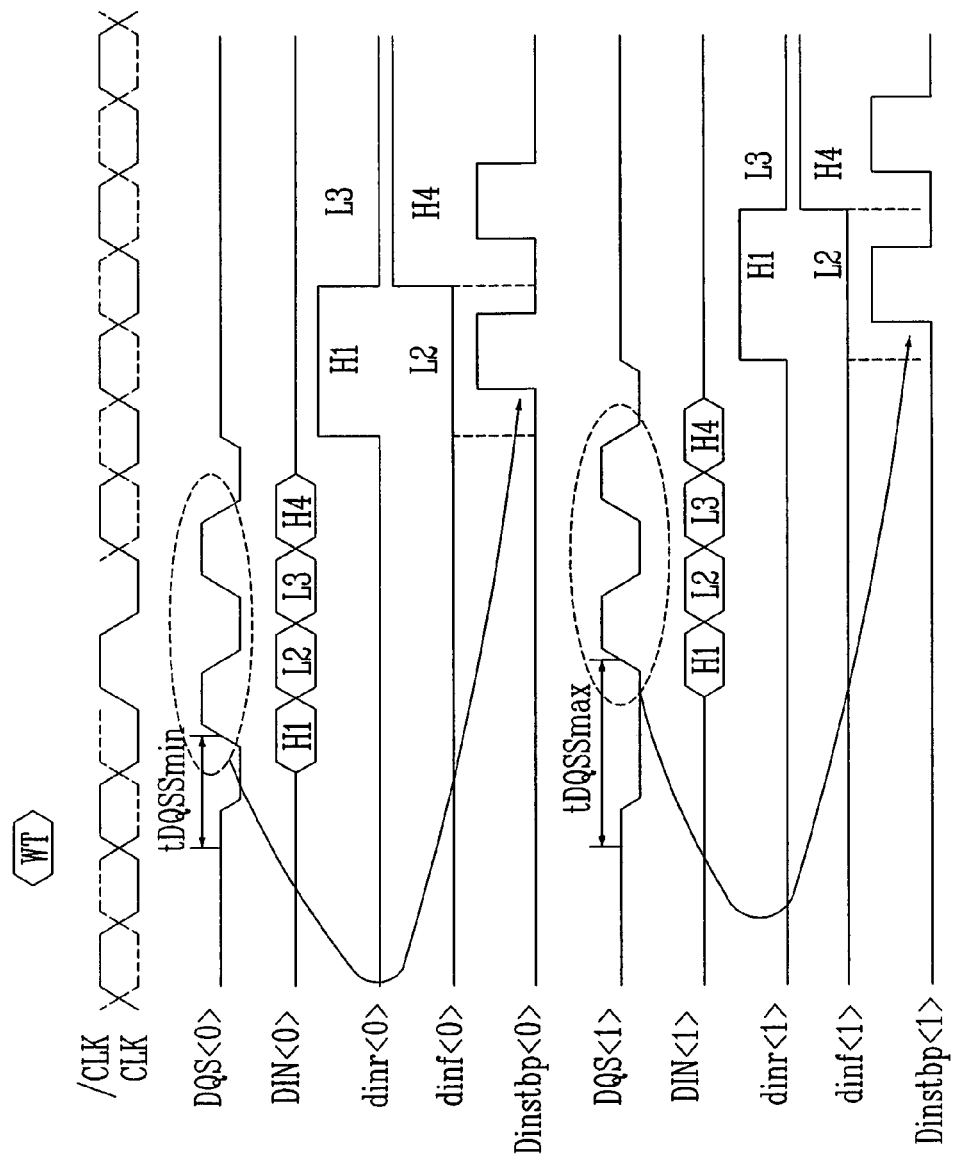
FIG. 5 is a timing diagram illustrating a data input path of DDR SDRAM shown in FIG. 3.

FIG. 5 is a timing diagram illustrating a data input path of DDR SDREAM shown in FIG. 2.

Referring to FIG. 5, the data strobe signal DQS is inputted within a predetermined time tDQSSmin to tDQSSmax after inputting a write command WT. However, as the data input strobe pulse dinstbp is generated by a pulse-type data strobe pulse dsp of the data strobe signal DQS, the data strobe pulse dinstbp is inputted within a predetermined time tDQSSmin to tDQSSmax after inputting the write command.

Here, as the data strobe signal DQS controls all the transmission of the rising data dinr and the falling data dinf and the generation of the data input strobe pulse dinstbp, when the data dinr, dinf are inputted to the global input/output transmission unit 260, the data input strobe pulse dinstbp is applied by an exact timing, which leads to correctly load the data dinr, dinf to the output bus GIO.

That is, after a write command, a margin between the data strobe signal DQS and the data input strobe pulse dinstbp is constantly maintained, regardless of the time tDQSSmin to tDQSSmax inputting the data strobe signal DQS. As a result, a timing that the rising data dinr or the falling data dinf is inputted to the global input/output transmission unit 260, and an arrangement of the data dinr, dinf with the data input strobe pulse dinstbp as a command signal loading the data dinr, dinf to the output bus GIO is exactly performed at any time.

That is, it is always exactly arranged although an operation speed is getting faster.

As described earlier, the present invention can improve reliability of a circuit operation by transferring data inputted after applying the data strobe signal DQS to the input/output bus GIO by an exact timing, by means of correctly arranging the data strobe signal DQS with the data input strobe pulse dinstbp regardless of a time difference tDQSSmin to tDQSSmax inputting the data strobe signal DQS after a write command, in response to generating the data input strobe pulse dinstbp used to load data to the input/output bus GIO as the data strobe pulse dsp identical to the data strobe signal DQS.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A data input apparatus of DDR SDRAM, comprising:
   a data strobe buffer for generating a first signal and a second signal by dividing a data strobe signal and further generating a data strobe pulse signal by delaying the data strobe signal;
   a data strobe signal division unit for generating a rising edge detecting pulse signal and a falling edge detecting pulse signal in response to the first and second signals;
   a data input means for dividing an input data inputted from an external of a chip into a rising data and a falling data and then outputting them according to the rising edge detecting pulse signal and the falling edge detecting pulse signal;
   an input control signal generation unit for generating a data input strobe pulse signal in order to control that the rising data and the falling data are transferred to an output bus in response to the data strobe pulse signal; and
   a global input/output transmission unit for transferring the rising data and the falling data to the output bus in response to the data input strobe pulse signal.

2. The data input apparatus of DDR SDRAM of claim 1, wherein the data input means includes:
   a data input buffer for buffering the input data inputted from an input terminal;
   a rising data latch for latching an input data outputted from the data input buffer according to the rising edge detecting pulse signal;
   a falling data latch for latching the input data outputted from the data input buffer according to the falling edge detecting pulse signal and then outputting it as a falling data; and
   a data arranging unit for arranging data outputted from the rising data latch according to the falling edge detecting pulse signal with the falling data and then outputting it as a rising data.

3. The data input apparatus of DDR SDRAM of claim 1, wherein generating the data strobe pulse signal comprises delaying the data strobe signal by a duration for transferring the input data to the global input/output transmission unit.

4. A data input method of DDR SDRAM, comprising the steps of:
   generating a rising edge detecting pulse signal, a falling edge detecting pulse signal and a data strobe pulse signal using a data strobe signal, wherein the rising edge detecting pulse signal and the falling edge detecting pulse signal are generated by dividing the data strobe signal and the data strobe pulse signal is generated by delaying the data strobe signal;

dividing an input data into a rising data and a falling data according to the rising edge detecting pulse signal and the falling edge detecting pulse signal and then outputting them;

generating a data input strobe pulse signal for controlling that the rising data and the falling data are transferred to an output bus in response to the data strobe pulse signal; and transferring the rising data and the falling data to an output bus in response to the data input strobe pulse signal.

5. The data input method of DDR SDRAM of claim 4, wherein generating the data strobe pulse signal comprises delaying the data strobe signal by a duration for transferring the input data to the global input/output transmission unit.

6. A data input apparatus of DDR SDRAM, comprising:
a data strobe buffer for outputting a first signal, a second signal and a data strobe pulse signal using a data strobe signal, wherein the first signal and the second signal are generated by dividing the data strobe signal;

a data strobe signal division unit for generating a rising edge detecting pulse signal and a falling edge detecting pulse signal in response to the first and second signals;

a data input means for dividing an input data inputted from an external of a chip into a rising data and a falling data and then outputting them according to the rising edge detecting pulse signal and the falling edge detecting pulse signal;

an input control signal generation unit for delaying the data strobe pulse signal and then generating a data input strobe pulse signal using the delayed strobe pulse signal in order to control that the rising data and the falling data are transferred to an output bus; and a global input/output transmission unit for transferring the rising data and the falling data to the output bus in response to the data input strobe pulse signal.

7. The data input apparatus of DDR SDRAM of claim 6, wherein the data input means includes:
a data input buffer for buffering the input data inputted from an input terminal;

a rising data latch for latching an input data outputted from the data input buffer according to the rising edge detecting pulse signal;

a falling data latch for latching the input data outputted from the data input buffer according to the falling edge detecting pulse signal and then outputting it as a falling data; and a data arranging unit for arranging data outputted from the rising data latch according to the falling edge detecting pulse signal with the falling data and then outputting it as a rising data.

8. The data input apparatus of DDR SDRAM of claim 6, wherein the data strobe pulse signal is delayed by a duration for transferring the input data to the global input/output transmission unit.

* * * * *